United States Patent
Tickle

(10) Patent No.: US 6,351,841 B1
(45) Date of Patent: Feb. 26, 2002

(54) METHOD AND APPARATUS FOR CREATING MULTI-GATE TRANSISTORS WITH INTEGRATED CIRCUIT POLYGON COMPACTORS

(75) Inventor: Andrew C. Tickle, Petaluma, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 09/531,725

(22) Filed: Mar. 21, 2000

(51) Int. Cl.[7] ............................................. H01L 23/50
(52) U.S. Cl. .............................. 716/8; 716/9; 716/10; 716/11; 716/12
(58) Field of Search ....................... 716/8–12

(56) References Cited

U.S. PATENT DOCUMENTS

| | | | | |
|---|---|---|---|---|
| 5,535,134 A | * | 7/1996 | Cohn et al. ..................... | 716/8 |
| 5,604,680 A | | 2/1997 | Bamji et al. | |
| 5,610,831 A | | 3/1997 | Matsumoto | |
| 5,612,893 A | * | 3/1997 | Hao et al. ...................... | 716/8 |
| 5,634,093 A | | 5/1997 | Ashida et al. | |
| 5,675,501 A | * | 10/1997 | Aoki ............................ | 716/8 |
| 5,974,244 A | * | 10/1999 | Hayashi et al. ................ | 716/8 |
| 6,031,980 A | * | 2/2000 | Oota ............................ | 716/8 |
| 6,163,877 A | * | 12/2000 | Gupta ........................... | 716/8 |
| 6,209,119 B1 | * | 3/2001 | Fukui ........................... | 716/2 |

OTHER PUBLICATIONS

Sagantec Web Page, http://www.sagantec.com/dream_applications.html, no date.
Sagantec Web Page, http://sagantec.com/features.html, no date.
Virtuoso Compactor Datasheet (Web Page Version) 1997, Cadence Design Systems, Inc. Marketing Services.

* cited by examiner

Primary Examiner—Charles Bowers
Assistant Examiner—Erik J. Kielin
(74) Attorney, Agent, or Firm—Crosby, Heafey, Roach & May

(57) ABSTRACT

A method of creating multi-gate transistors with integrated circuit polygon compactors is disclosed. Specifically, in order to provide a more efficient layout when the size of a transistor is increased during design migration, a small multi-gate transistor is formed by inserting at least one parallel transistor over the diffusion layer of the target transistor, between a gate and contact. The compactor then enforces the new design rules, and adjusts the relative sizes of the parallel transistors as required. The resulting multi-gate transistor structure is much more compact than a single large transistor, providing a more efficient design layout.

24 Claims, 4 Drawing Sheets

METHOD AND APPARATUS FOR CREATING MULTI-GATE TRANSISTORS WITH INTEGRATED CIRCUIT POLYGON COMPACTORS

BACKGROUND OF THE INVENTION

1. Field of the Invention

The present invention relates generally to the field of integrated circuit compactors, and more particularly, to a method and apparatus for creating multi-gate transistors that are compatible with integrated circuit polygon compactors.

2. Description of the Related Art

As semiconductor manufacturing technology allows ever smaller feature sizes each year, many existing designs are modified to take advantage of the increased speed and density afforded by the new processes. The layout rules for a new technology are seldom the result of simply scaling the old rules. Usually the minimum widths, spaces and overlaps are reduced by different amounts. The process of modifying an integrated circuit layout to conform to a new set of layout rules is known as migration. For small designs, migration by manual re-layout may be acceptable. For larger designs of several million transistors, however, a tool called a compactor, such as Dream™ from Sagantec, is used. Dream™ stands for Design Rule Enforcement and Migration. A compactor reads the new design rules and moves the edges of the polygons representing the features on each layer of the old layout to force compliance with the new rules. A compactor simply recognizes shapes (edges) and adjusts the relative sizes of corresponding polygons, but does not change the number of polygons. In other words, a compactor does not add any, new structure and therefore the resulting new layout has the same number of polygons as the original layout.

After a design has been migrated to a new process, it is oftentimes desirable to optimize the speed and reduce the power of the design by tuning transistor sizes with a tool such as Virtuoso Core Optimizer™ from Cadence or AMPS™ from Synopsis. Having determined the desired sizes of the transistors, a compactor can then be used to change the transistor sizes. The desired transistors are re-sized by the compactor in accordance with a list of sizes, names and/or locations of the transistors. In order to provide additional space for the larger transistors, the compactor also adjusts the features of the surrounding areas to be as tightly packed as possible without violating the design rules.

In order to meet the timing requirements, many transistor sizes may increase in size several times, as shown in FIG. 1. Each transistor 10, 12 consists of a diffusion region 14, a polysilicon layer 16, and contacts 181, 182. Note that the "large" transistor 12 is much longer than the "small" transistor 10, and normally includes extra contacts 183–186. One of the biggest limitations of the standard polygon layout compactor is that when transistor sizes need to be increased significantly (i.e., several times) in order to meet the timing requirements, the enlarged transistors may extend well beyond the compact group to which they belong. Since transistors cannot overlap adjacent regions, the adjacent regions have to be moved to make space for the enlarged transistors. This causes wasteful and unsightly gaps in the layout, which reduces the density.

For manual custom designs, the solution is to construct a multi-gate transistor to replace the single large gate transistor. A multi-gate transistor, illustrated in FIG. 2(a), is actually a compact set of smaller transistors sharing common source 22 and drain 24 areas, and having connected gates 20. The smaller transistors are connected so that they are electrically in parallel (as illustrated by the equivalent circuit of FIG. 2(b)), and thus act as a single transistor of the same effective size as the original larger one. A multi-gate transistor can be formed to be roughly square, thus producing a compact design. The single large equivalent transistor would be much longer, and much more difficult to efficiently place in the layout.

The basic compactor algorithms, however, cannot perform this process, since the compactor only moves polygon edges. In other words, prior art compactors are not capable of creating new structures (other than arrays of contacts).

SUMMARY OF THE INVENTION

In general, the present invention is a method and apparatus for creating multi-gate transistors with integrated circuit polygon compactors. More particularly, in order to provide a more efficient layout when the size of a transistor is increased during design migration, a small multi-gate transistor is formed by inserting at least one parallel "narrow" transistor over the diffusion layer of a target transistor, between a gate and contact. The compactor then enforces the new design rules, and adjusts the relative sizes of the parallel transistors as required. The resulting multi-gate transistor structure is much more compact than a single large transistor, providing a more efficient design layout.

Thus, the present invention makes it practical to use a polygon compactor for making significant changes in transistor sizes, such as required when optimizing the speed of a circuit. Without the present invention, the layout would become distorted and have lower density. The present invention applies generally to polygon compactors capable of changing the sizes of transistors in a layout using sizing information stored in a data file, and that enforce compliance with the design (layout) rules in a space conserving manner. These and other aspects of the invention, as well as further details of specific embodiments, may be more fully understood from the following specification and drawings.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The following description is provided to enable any person skilled in the art to make and use the invention and sets forth the best modes contemplated by the inventor for carrying out the invention. Various modifications, however, will remain readily apparent to those skilled in the art, since the basic principles of the present invention have been defined herein specifically to provide a method and apparatus for creating multi-gate transistors that are compatible with integrated circuit polygon compactors. Any and all such modifications, equivalents and alternatives are intended to fall within the spirit and scope of the present invention.

In general, the present invention introduces a "narrow" transistor structure into the diffusion layer of a target transistor between the gate and a contact, prior to invoking a polygon compactor program on an integrated circuit design layout. This procedure produces a multi-gate transistor, also known as a "folded" transistor gate, which is much more compact than a single large transistor.

Figure 1:
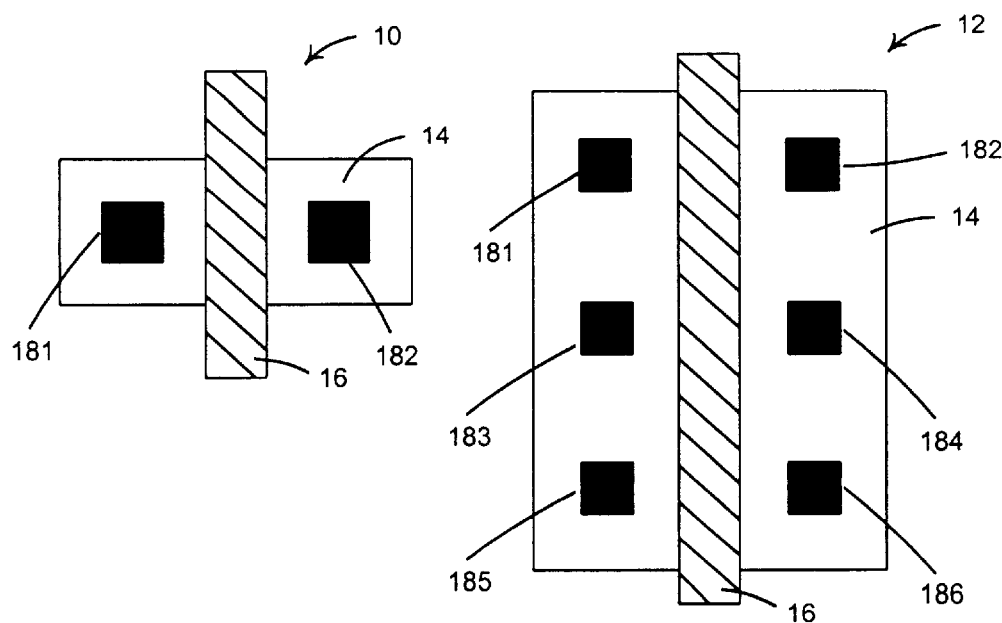
FIG. 1 is a diagram of a small transistor and a large transistor.
Figure 2A:
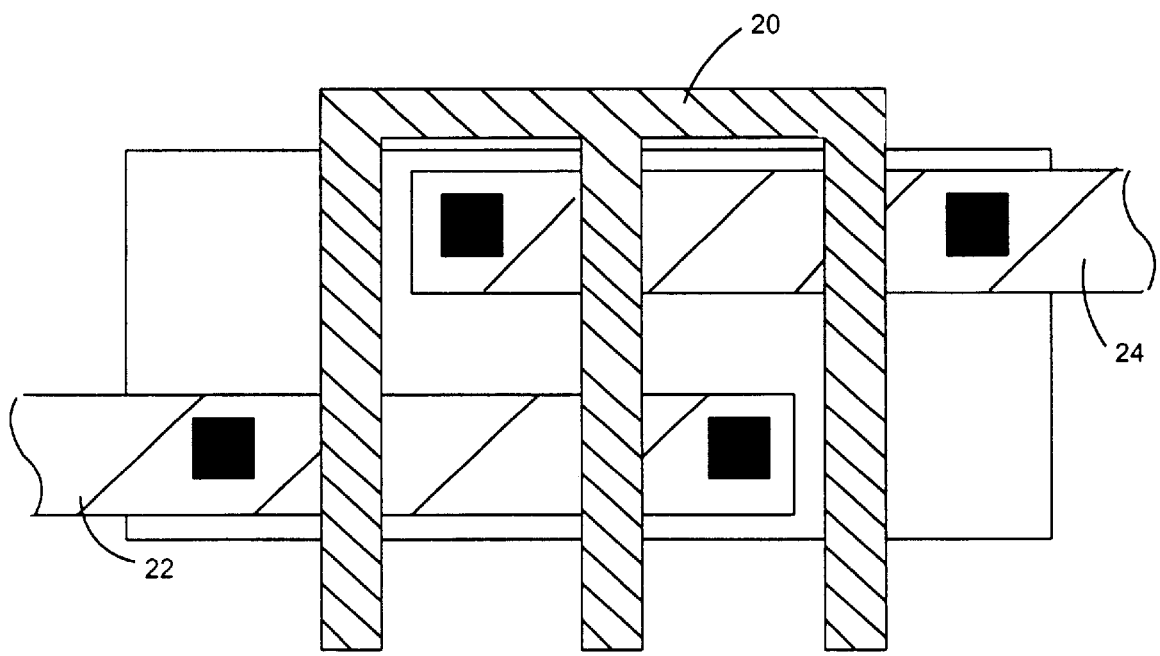
FIG. 2(a) is a multi-gate transistor consisting of three transistors in parallel and FIG. 2(b) is the equivalent circuit of the structure of FIG. 2(a)
Figure 2B:
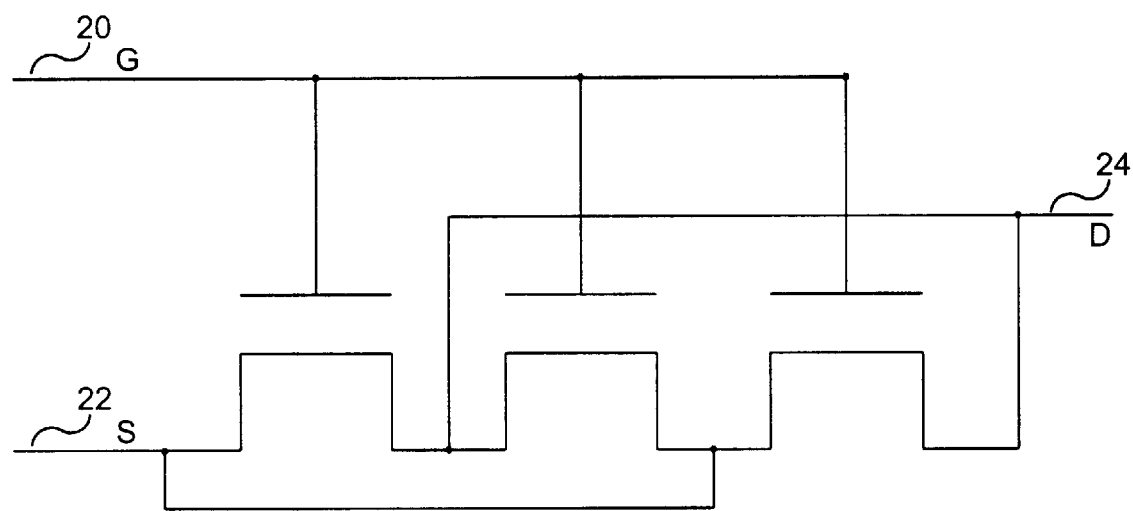
Figure 3:
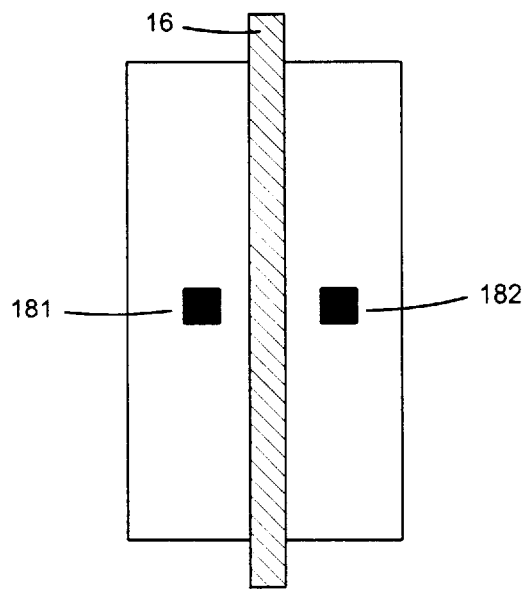
FIG. 3 shows a single-gate transistor before converting to a multi-gate transistor.
Figure 4:
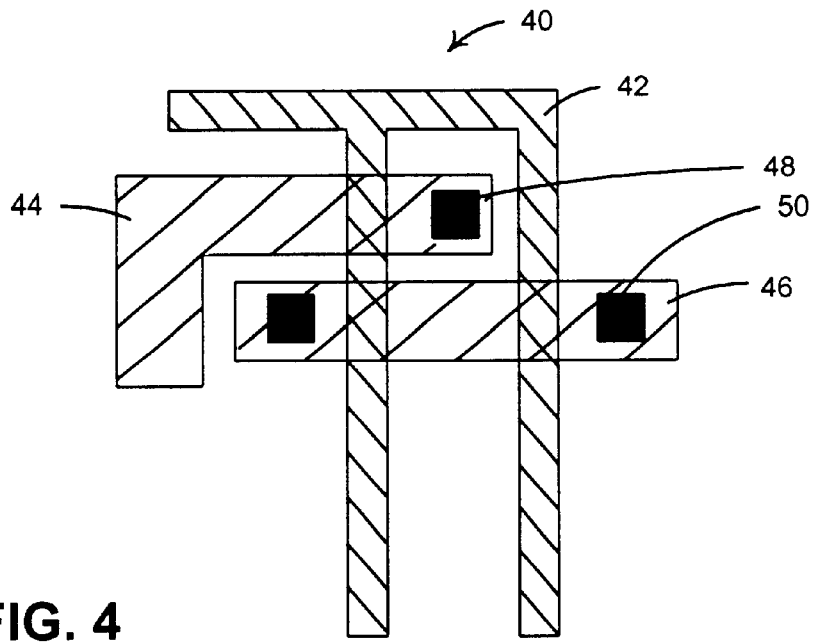
FIG. 4 is a two-gate narrow transistor structure to be inserted between the original transistor and the right edge of the diffusion.
Figure 5:
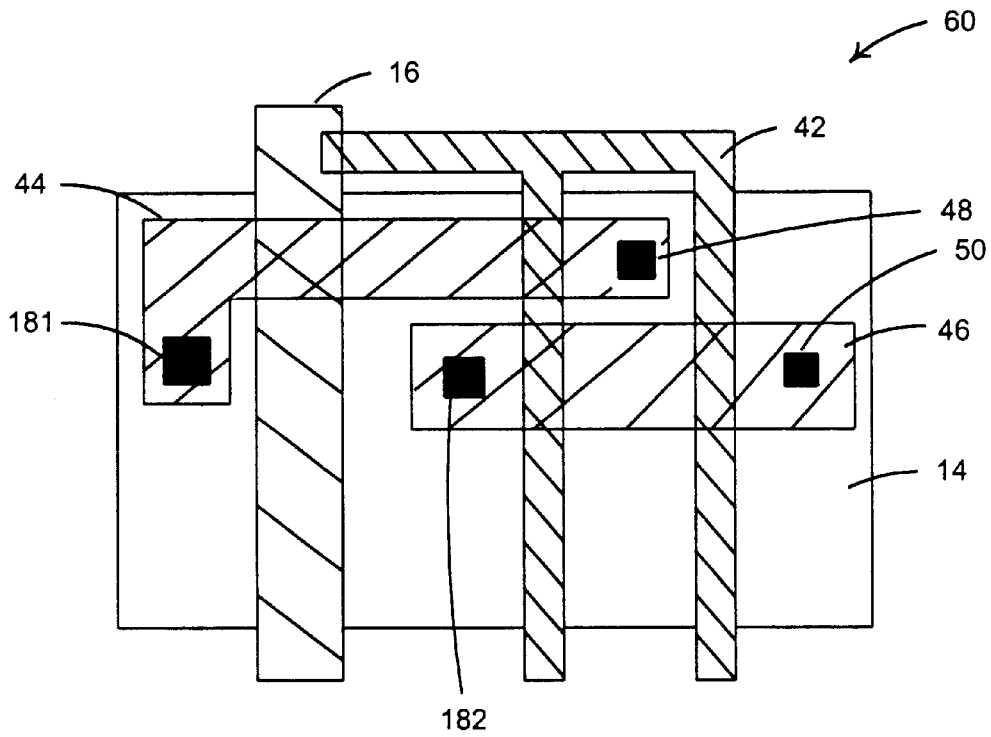
FIG. 5 is a two-gate narrow transistor after adding it to the original transistor but before design rule enforcement.

FIG. 3 illustrates a typical wide single-gate transistor 30, having a diffusion region 14, polysilicon layer 16, and contacts 181, 182. According to the present invention, an extremely narrow transistor structure 40 containing additional gates 42, metallization 44, 46 and contacts 48, 50, as shown in FIG. 4, is placed in the layout next to a single-gate transistor that is to be split into multiple gates. Typically, the structure 40 is added by finding the location of the edge of the transistor gate in the layout and thereby inserting the new structure. The inserted structure 40 is made extremely narrow so that it fits between the transistor's contact 182 and one edge of the diffusion, as shown in FIG. 5, without overlapping any other features. In fact, the structure 40 is deliberately smaller than the minimum size that the design rules would typically allow. Specifically, the distance between the target transistor gate and the contact has to be represented in the device database by enough "units" (typically 20 or more) so that the small transistor (with width and spaces typically defined by single units) can be inserted without overlapping the target gate, and yet still be recognized by the compactor.

Figure 6:
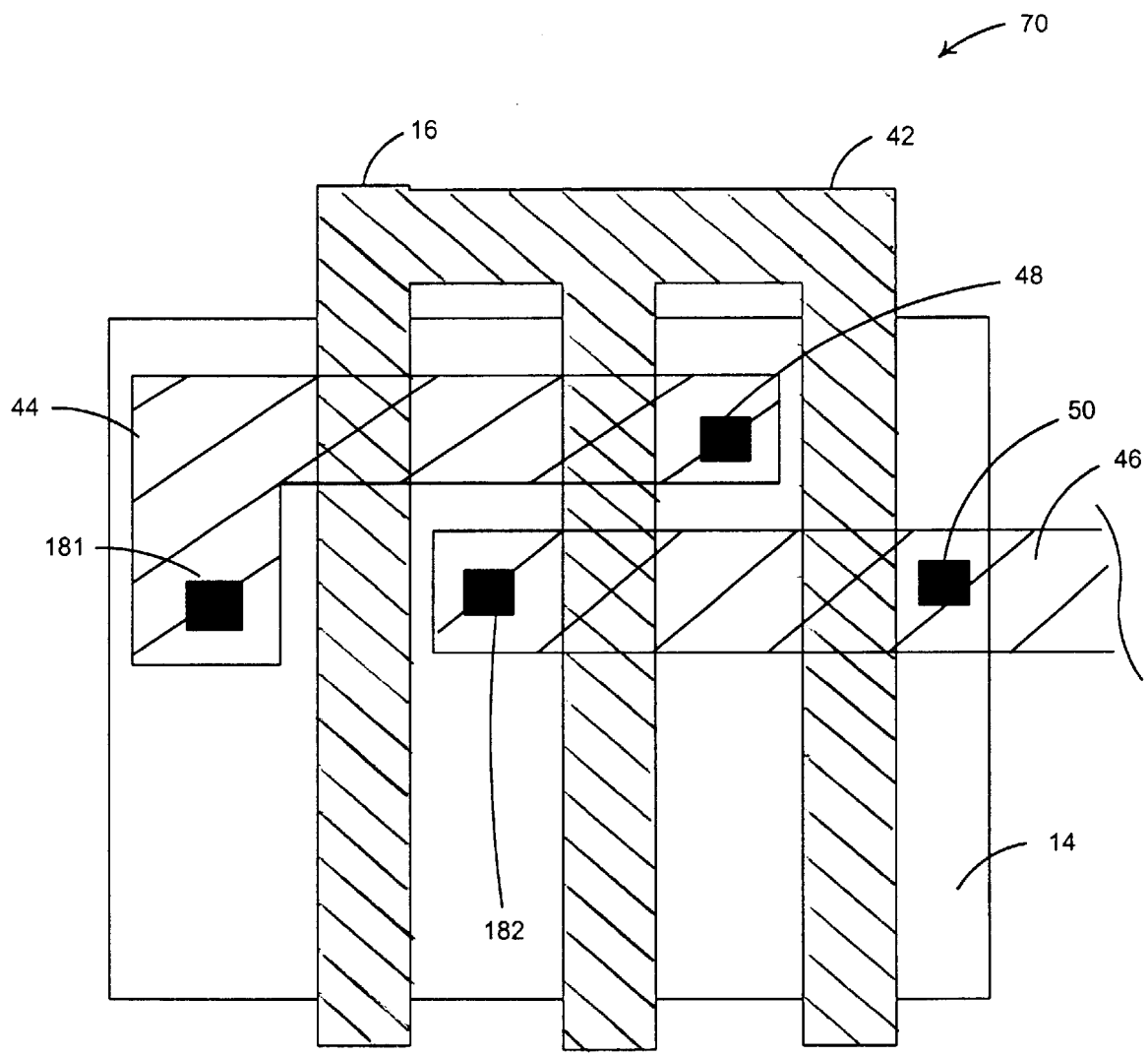
FIG. 6 is a multi-gate transistor after design rule enforcement.

When a compactor is run, it enforces design rule compliance as shown in FIG. 6, and also sets the additional transistor gate sizes to the values specified in an input file. The metal segments connect the two new transistor structures in parallel with the original transistor so that it acts as a single transistor with multiple gates. Before the design is introduced to the compactor, the coordinates are multiplied by a large number on the order of a hundred to a thousand. This allows the narrow structure to have typical feature widths of single units. Thus, the structural features of the multi-gate transistor 70 fully comply with the new set of design rules after the compactor has been run.

If, for example, a five micron wide transistor is to be increased to eighteen microns, and the largest size allowed for a single transistor is seven microns, then the original transistor will be replaced by three six-micron transistors. Assuming that the transistor in FIG. 3 is five microns wide, its size in a new size data file will therefore be increased from five microns to six microns. The narrow transistor structure of FIG. 4, comprising two additional gates, is added to the layout. The new structure is small enough so that it will fit into the small existing space in the original transistor's diffusion layer. Two new transistors will be added to the new size data file for the added transistors and they will also be specified to be six microns. The length of each transistor (in the direction of current flow) is specified to match the original transistor. When the compactor is run, the narrow transistors will be expanded and the added contacts and metal connections expanded and spaced according to the new design layout rules, resulting in the structure illustrated in FIG. 6.

The key feature of the invention is the addition of the expandable narrow structure to the layout. It is not particularly material how the structure is created or what technique is used to place it in the layout. For example, one technique for implementing the present invention is with a library of standard cells. A small number of structures containing one, two, three, or more transistors could be created and added to a standard library. The structures could then be selected manually and inserted according to location, prior to running a compactor. Another established technique for creating the structure is to use Cadence's pcells (parametizable cells). The most sophisticated method would be to create and place the narrow structures automatically, by having a compactor explore the space, orientation, and contact positions of an existing transistor and determine whether adding a multi-gate transistor according to the present invention would provide a more compact design.

Although the present invention has been illustrated by showing a structure containing two additional gates, any number of additional gates may be added as desired. It has been determined, however, for ease of implementation, that the resulting multi-gate transistor should preferably have an odd number of gates. If the right hand contact of a single transistor in the original layout is the drain, then after adding an even number of small transistor gates (to keep the total number odd) the right-most contact is still the drain. If the total number of the transistor gates is even, however, then the drain connection would be to an intermediate contact which may require re-routing the drain connection metallization.

Thus, the present invention makes it practical to use a polygon compactor for making significant changes in transistor sizes, such as required when optimizing the speed of a circuit. Without the present invention, the layout would become distorted and have lower density. The present invention applies generally to polygon compactors capable of changing the sizes of transistors in a layout using sizing information stored in a data file, and that enforce compliance with the design (layout) rules in a space conserving manner.

Those skilled in the art will appreciate that various adaptations and modifications of the just-described embodiments can be configured without departing from the scope and spirit of the invention. Therefore, it is to be understood that, within the scope of the appended claims, the invention may be practiced other than as specifically described herein.

What is claimed is:

1. A method of creating a multi-gate transistor for use in an integrated circuit layout, the method comprising:
    finding a location that corresponds to an edge of a gate of a single gate transistor in a layout of a circuit design;
    forming a narrow transistor structure comprising at least one transistor having a size smaller than that provided for by design rules of said layout; and
    splitting the single gate transistor into multiple gates by,
    inserting the narrow transistor structure over a diffusion layer and between a gate, a contact, and an edge of said diffusion layer of the single gate transistor,
    multiplying coordinates of the inserted narrow transistor structure by an order of magnitude sufficient to result in widths of features of the narrow transistor in single units and result in structural features of the resulting multi-gate transistor to comply with the design rules after a compaction process, and
    running a compactor on said layout that performs the steps of,
       enforcing compliance of the design rules of said layout, setting gates of the narrow transistor structure to values specified in an input file, expanding metal segments of the inserted narrow structure according to the design rules, and connecting the inserted narrow structure in parallel with the single gate transistor via the expanded metal segments;

wherein:

said single gate transistor, prior to insertion in said diffusion layer, is represented in a device database of components used in said layout as a transistor having a size defined in units sufficient enough to allow insertion of the narrow transistor structure without overlapping other features of the single gate transistor.

2. The method of claim 1, wherein said size smaller than that provided by design rules of said layout comprises a size smaller than a minimum gate to contact dimension.

3. The method of claim 2, wherein the narrow transistor structure comprises a plurality of transistor structures electrically connected in parallel.

4. The method of claim 3, wherein the narrow transistor structure comprises an even number of transistor structures.

5. The method of claim 1, wherein said step of running a compactor comprises running a polygon compactor program on the integrated circuit layout, wherein the polygon compactor program adjusts the dimensions of the target transistor and the narrow transistor structure to conform to a set of design rules, forming a relatively compact multi-gate transistor.

6. The method of claim 5, wherein said step of multiplying comprises setting a size value of the single gate transistor and a size value of the narrow transistor structure before running the polygon compactor program.

7. The method of claim 6, wherein:

said database of components comprises a set of structures defined in a library of standard cells; and said method further comprises the step of selecting the narrow transistor structure from said library.

8. The method of claim 7, wherein said step of inserting further comprises manually inserting the narrow transistor structure as directed by a designer into the integrated circuit layout.

9. The method of claim 5, wherein said step of forming further comprises the step of creating the narrow transistor structure using a parametizable cell.

10. The method of claim 5, wherein the narrow transistor structure is inserted over the diffusion layer of the single gate transistor in accordance with pre-defined parameters.

11. A device for creating a multi-gate transistor for use in an integrated circuit layout design migration using a polygon compactor, comprising:

means for finding a location that corresponds to an edge of a gate of a single gate transistor in a layout of a circuit design;

means for forming a narrow transistor structure comprising at least one transistor having a size smaller than that provided for by design rules of said layout; and means for splitting the single gate transistor into multiple gates;

wherein:

said means for splitting comprises, means for inserting the narrow transistor structure over a diffusion layer and between a gate, a contact, and an edge of said diffusion layer of the single gate transistor, means for setting a size value of the single gave transistor and a size value of the narrow transistor structure, said means for setting comprises means for multiplying coordinates of the inserted narrow transistor structure by an order of magnitude sufficient to result in widths of features of the narrow transistor in single units and result in structural features of the resulting multi-gate transistor to comply with the design rules after said polygon compaction; and means for performing a polygon compaction on said layout, comprising, means for enforcing compliance of the design rules of said layout, means for setting gates of the narrow transistor structure to values specified in an input file, means for expanding metal segments of the inserted narrow structure according to the design rules, and means for connecting the inserted narrow structure in parallel with the single gate transistor via the expanded metal segments; and said single gate transistor, prior to insertion in said diffusion layer by said means for inserting, is represented in a device database of components used in said layout as a transistor having a size defined in units sufficient enough to allow insertion of the narrow transistor structure without overlapping other features of the single gate transistor.

12. The method of claim 11, wherein the narrow transistor structure is smaller than a minimum gate to contact dimension.

13. The method of claim 12, wherein the narrow transistor structure comprises a plurality of transistor structures electrically connected in parallel.

14. The method of claim 13, wherein the narrow transistor structure comprises an even number of transistor structures.

15. The method of claim 11, wherein the polygon compactor program adjusts the dimensions of the single gate transistor and the narrow transistor structure to conform to a set of design rules, forming a relatively compact multi-gate transistor.

16. The method of claim 11, wherein the narrow transistor structure is selected from among a set of structures defined in a library of standard cells.

17. The method of claim 16, wherein said means for inserting comprises a manual insertion of the narrow transistor structure at the direction of a designer into the integrated circuit layout.

18. The method of claim 11, wherein the polygon compactor program automatically inserts the narrow transistor structure into the single gate transistor location, in accordance with pre-defined parameters, during program execution.

19. The device according to claim 11, wherein said means for setting comprises means for multiplying coordinates of the inserted narrow transistor structure by an order of magnitude sufficient to result in widths of features of the narrow transistor in single units and result in structural features of the resulting multi-gate transistor to comply with the design rules after said polygon compaction.

20. A device for creating a multi-gate transistor for use in an integrated circuit layout design migration using a polygon compactor, comprising:

a locating device configured to find a location that corresponds to an edge of a gate of a single gate transistor in a layout of a circuit design;

a forming mechanism configured to form a narrow transistor structure comprising at least one transistor having a size smaller than that provided for by design rules of said layout; and a splitting device configured to split the single gate transistor Into multiple gates;

wherein:

said splitting device comprises, an insertion mechanism configured to insert the narrow transistor structure over a diffusion layer and between a gate, a contact, and an edge of said diffusion layer of the single gate transistor, a setting mechanism configured to set a size value of the single gate transistor and a size value of the narrow transistor structure, wherein said setting mechanism comprises a multiplication device configured to multiply coordinates of the inserted narrow transistor structure by an order of magnitude sufficient to result in widths of features of the narrow transistor in single units and result in structural features of the resulting multi-gate transistor so comply with the design rules after the polygon based compaction, and a polygonal compaction device configured to perform polygon based compaction on said layout, comprising, an enforcement mechanism configured to enforce compliance of the design rules of said layout, a gate set device configured to set gates of the narrow transistor structure to values specified in an input file, an expansion device configured to expand metal segments of the Inserted narrow structure according to the design rules, and a connection mechanism configured to connect the inserted narrow structure in parallel with the single gate transistor at the expanded metal segments; and said single gate transistor, prior to insertion in said diffusion layer by said means for inserting, is represented in a device database of components used in said layout as a transistor having a size defined in units sufficient enough to allow insertion of the narrow transistor structure without overlapping other features of the single gale transistor.

21. The device according to claim 20, wherein said setting mechanism comprises a multiplication device configured to multiply coordinates of the inserted narrow transistor structure by an order of magnitude sufficient to result in widths of features of the narrow transistor in single units and result in structural features of the resulting multi-gate transistor to comply with the design rules after the polygon based compaction.

22. The device according to claim 21, wherein said polygonal compaction device comprises:

a device description file of a narrow transistor structure, the narrow transistor structure being smaller than a minimum gate to contact dimension in a first set of design rules;

wherein the narrow transistor structure is placed over a diffusion layer of a target transistor to create said multi-gate transistor.

23. A computer readable media having instructions stored thereon, that, when loaded into a computer, cause the computer to perform the step of:

creating a multi-gate transistor for use in an integrated circuit layout;

wherein:

said step of creating comprises the steps of, finding a location that corresponds to an edge of a gate of a single gate transistor in a layout of a circuit design, forming a narrow transistor structure comprising at least one transistor having a size smaller than that provided for by design rules of said layout, and splitting the single gate transistor into multiple gates by, inserting the narrow transistor structure over a diffusion layer and between a gate, a contact, and an edge of said diffusion layer of the single gate transistor, multiplying coordinates of the inserted narrow transistor structure by an order of magnitude sufficient to result in widths of features of the narrow transistor in single units and result in structural features of the resulting multi-gate transistor to comply with the design rules after a compaction process, and running a compactor on said layout that performs the steps of, enforcing compliance of the design rules of said layout, setting gates of the narrow transistor structure to values specified in an input file, expanding metal segments of the inserted narrow structure according to the design rules, and connecting the inserted narrow structure in parallel with the single gate transistor via the expanded metal segments;

wherein said single gate transistor, prior to insertion in said diffusion layer, is represented in a device database of components used in said layout as a transistor having a size defined in units sufficient enough to allow insertion of the narrow transistor structure without overlapping other features of the single gate transistor.

24. The method of claim 1, wherein the narrow transistor structure comprises an even number of transistor structures.

* * * * *